United States Patent [19]
Pollitt

[11] 4,093,874
[45] June 6, 1978

[54] CONSTANT IMPEDANCE MOSFET SWITCH

[75] Inventor: Glenn A. Pollitt, Burnaby, Canada

[73] Assignee: GTE Lenkurt Electric (Canada) Ltd., Burnaby, Canada

[21] Appl. No.: 755,422

[22] Filed: Dec. 29, 1976

[30] Foreign Application Priority Data

Feb. 10, 1976 Canada .................................... 245393

[51] Int. Cl.² .................... H03K 17/12; H03K 17/14; H03K 17/68; H03G 3/30
[52] U.S. Cl. .................................. 307/251; 307/310; 307/352; 330/284
[58] Field of Search ............... 307/251, 310, 351–353; 328/150, 151; 330/145, 284

[56] References Cited

U.S. PATENT DOCUMENTS

| | | | |
|---|---|---|---|
| 3,449,688 | 6/1969 | Brown | 307/251 X |
| 3,678,297 | 7/1972 | Takahashi | 307/251 |
| 3,720,848 | 3/1973 | Schmidt, Jr. | 307/251 |
| 3,740,581 | 6/1973 | Pfiffner | 307/251 |
| 3,764,921 | 10/1973 | Huard | 307/251 X |
| 3,866,064 | 2/1975 | Gregory et al. | 307/251 |
| 3,902,078 | 8/1975 | Peterson | 307/251 |
| 3,908,136 | 9/1975 | Volmier | 307/251 |

*Primary Examiner*—Larry N. Anagnos
*Attorney, Agent, or Firm*—Douglas M. Gilbert

[57] ABSTRACT

A compensation circuit connected across the source and gate electrodes of a MOSFET switch provides a compensating voltage across these electrodes such that the value of the ON resistance, $R_{ON}$, from source to drain remains constant despite ambient temperature variations and in the presence of an analog input signal the compensation circuit provides a compensating voltage across these same electrodes such that the value of $R_{ON}$ remains constant despite variations in the amplitude of the input signal.

4 Claims, 2 Drawing Figures

CONSTANT IMPEDANCE MOSFET SWITCH

BACKGROUND OF THE INVENTION

The present invention is directed to a MOSFET switching circuit and more specifically, to a MOSFET switching circuit used for sampling analog signals.

There are several characteristics of the MOSFET type device that make it attractive as a circuit element for analog switching applications. Aside from fabrication properties, the device as a circuit element exhibits essentially infinite input impedance, zero output offset voltage very high source-to-drain resistance in the off state (i.e. good isolation) and relatively low source-to-drain resistance in the on state. The latter property is true for operation in the triode region but not for saturation operation. The source-to-drain resistance in the on state, $R_{on}$, is typically 30 to 300 ohms for an N-channel type MOSFET. Unfortunately, $R_{ON}$ is a variable function of temperature, T, and gate-to-source voltage, $V_{GS}$. An increase in device temperature will cause an increase in device resistance. Large increases in temperature can cause changes in $R_{ON}$ by as much as two times the lowest value of $R_{ON}$. The dominant factor influencing the temperature dependence of the device is the loss carrier mobility in the inversion layer as temperature increases. $R_{ON}$ also varies inversely with gate-to-source voltage. Analog voltage variations across the gate and source electrodes can cause noticeable changes in $R_{ON}$. Quantitatively voltage variations can cause corresponding changes in resistance by as much as three times the lowest value of $R_{ON}$.

It is therefore, a broad object of the present invention to provide an improved MOSFET switching circuit having a constant $R_{ON}$.

It is also an object of the present invention to provide an analog MOSFET switching circuit having a compensation circuit which varies the gate-to-source voltage in such a way as to stabilize the value of $R_{ON}$ despite changes in ambient temperature or despite analog signal variations.

SUMMARY OF THE INVENTION

In accordance with the present invention, there is provided a MOSFET switching device, having first and second mutually exclusive conductive states, the first conductive state characterized by an internal resistance, $R_{ON}$, and the second conductive state characterized by an internal resistance $R_{OFF}$, wherein $R_{OFF} > R_{ON}$.

The MOSFET source electrode receives an analog signal, and, when the device is in the first conductive state, the drain electrode transmits an output signal proportional to the input analog signal. A bias circuit, connected to the MOSFET source, gate, and substrate electrodes, provides the appropriate bias voltages to the MOSFET device to place the switching circuit in the appropriate conductive state in response to an external control signal. A compensation circuit, connected across the MOSFET source and gate electrodes, provides, in the absence of an input analog signal, a compensating voltage across these electrodes such that the value of $R_{ON}$ remains constant despite ambient temperature variations. Also the compensation circuit provides, in the presence of an input analog signal, a compensating voltage across these electrodes such that $R_{ON}$ remains constant despite analog signal variations.

BRIEF DESCRIPTION OF THE DRAWINGS

An illustrative embodiment of the invention will now be described, with reference to the accompanying drawings, in which.

DETAILED DESCRIPTION OF THE DRAWINGS

Figure 1:
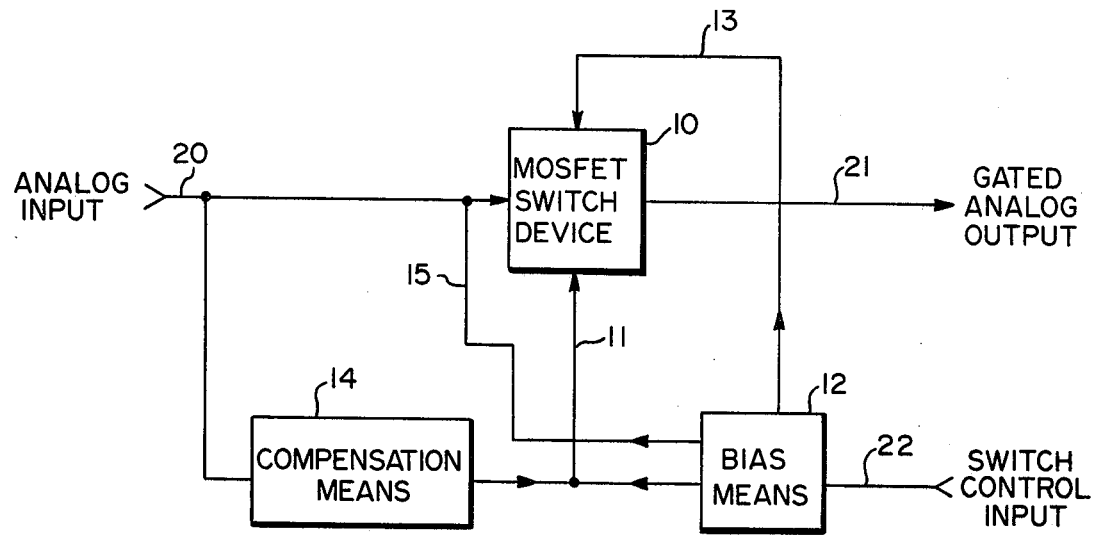
FIG. 1, shows in block diagram form a constant impedance MOSFET switching circuit utilizng a compensation circuit to achieve impedance stabilization.

In FIG. 1 is shown a MOSFET switching device 10 having a source electrode for receiving an analog signal, a drain electorde for transmitting an output analog signal, a gate electrode with an input connection 11, and a substrate electrode with input connection 13. The gate and substrate electrodes are used for applying a bias voltage, via bias means 12, which directly controls the on/off conductive state of the switching device. The particular conductive state of this device depends on the state of control input signal. The control input signal is connected to the bias circuitry 12 via connection 22. Compensation circuit 14, connected across the source and gate electrodes, provides a compensating voltage at the gate electrode to stabilize the source-to-drain resistance in the ON state, despite either changes in ambient temperature or analog signal variations at connection 20. FIG. 1, provides a general over-view of the circuitry shown in more detail in FIG. 2.

Figure 2:
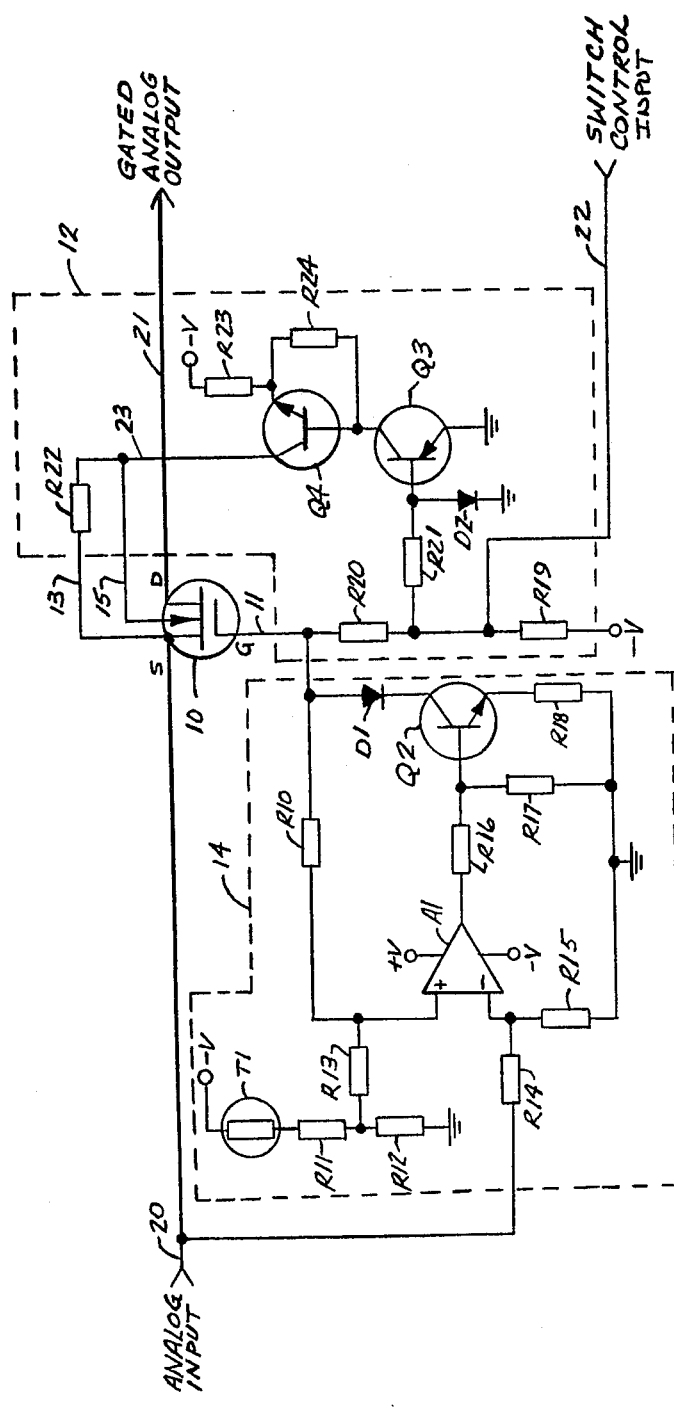
FIG. 2, is a schematic diagram of one embodiment of this invention.

MOSFET 10 is shown in FIG. 2 as an N-channel depletion-mode device. The current-voltage characteristics of this device are such that zero or positive going gate-to-source voltage $(+V_{GS})$ places the device in a conducting state (ON) assuming the source-substrate junction is not forward biased. A negative threshold voltage $(-V_{GS})$ will terminate the conduction state. The foregoing assumes that the source-substrate and/or drain-substrate conjunction is not allowed to become forward biased. A forward biased substrate junction would, at a minimum, upset the continuous inversion layer during the ON state. In the OFF state current would be conducted through the substrate, possibly causing damage to the device, and causing a distorted leakage signal through the OFF device.

MOSFET 10 is placed in the ON conductive state by an appropriate positive bias voltage applied to the switch control input $(+V)$. This forces $V_{GS}$ positive and places MOSFET 10 in conduction. The positive control voltage is also applied through resistor R21 to the base of Q3 turning this bias transistor off. Diode D2 from the base of Q3 to ground merely protects the base-to-emitter junction of Q3 from excessive reverse bias voltages. With Q3 off, Q4 is also turned off permitting the substrate voltage on connection 15 to follow the source voltage through resistor R22. (R22 should typically be 20kΩ to permit the substrate to follow the source voltage exactly during the ON state, since any change in $V_S - V_{SS}$ will cause the analog output on 21 to be modulated by this voltage).

The MOSFET 10 is switched to the OFF conductive state when the switch control input on 22 goes from a positive voltage $(+V)$ to an open circuit. An open circuit connection on lead 22 permits the negative supply voltage $(-V)$ to negatively bias the gate electrode through resistors R19 and R20. As long as the substrate-source, and/or substrate-drain junction is not forward biased, a $-V_{GS}$ will hold MOSFET in the OFF state. In FIG. 2, it is assumed that the analog input voltage is not permitted to go negative. (If however, the input voltage could go either positive or negative, then R19 and R20 should be selected so that the bias voltage at the gate would be sufficiently negative to hold $V_{GS}$ negative). A negative voltage at the junction of R19 and R20 is also applied through resistor 21 to the base of Q3 permitting Q3 to turn on. When Q3 goes into saturation Q4 is supplied with a base current sufficient to turn Q4 also on. Resistors R23 and R24 provide bias voltages for Q4. The MOSFET bias circuitry 12 must also maintain the substrate electrode 15 negative with respect to the source or drain electrode in the OFF conductive state. For negative input signal on 20 the emitter of Q3 and the cathode of D2 should be connected to a voltage more negative than the maximum analog negative excursion rather than a ground potential.

A compensation circuit 14 is connected to the analog input 20 and to the MOSFET gate electrode 11. This effectively places the compensation circuit 14 across the source and gate electrodes. The purpose of this circuit is to eliminate the undesirable effect of input voltage variations and temperature variations upon $R_{ON}$. Ignoring the temperature compensating aspect of the circuit for the moment, compensation circuit 14 causes the gate voltage to track the source voltage so as to maintain $V_{GS}$ at a particular fixed voltage. So long as $V_{GS}$ remains constant, $R_{ON}$ will remain constant and independent of source voltage variations. The manner by which the gate-to-source voltage is held fixed will be explained in the discussion of the compensation circuit 14 below.

The MOSFET device is temperature stablaized by appropriately increasing or decreasing the gate-to-source bias voltage, $V_{GS}$. By sensing a change in ambient temperature, a corresponding change in bias voltage can be made at the gate electrode increasing or decreasing $V_{GS}$. Since $R_{ON}$ increases monotonically with temperature, $V_{GS}$ must be increased appropriately to offset the effect of an ambient temperature increase. By testing the particular MOSFET device to be used, two sets of curves can be drawn; $V_{GS}$ v $R_{ON}$ and T v $R_{ON}$, where T = temperature. From these two curves a plot of $V_{GS}$ versus T can be made which provides the required information to stabalize $R_{ON}$ with temperature. This will be discussed in more detail following the circuit operation description.

The compensation circuit 14, from the input connection at 20 to the output connection at 11, is essentially an isolating amplifier having an overall voltage gain of 1. This provides the gate electrode with a correction voltage equal in magnitude and in phase with the voltage applied to the source electrode. The analog voltage is applied directly to the source electrode and to the inverting input of op-amp A1 through the voltage divider R14 and R15. Since R14 is equal to R15 only one half of the analog voltage is applied to the inverting input of A1. Op-amp A1 and transistor Q2 constitute a very high gain amplifier having a closed loop voltage gain controlled by resistors R10, R11, R12 and R13 and by thermistor T1. The closed loop voltage gain is fixed at 2 so that the overall voltage gain will be 1. Resistors R16 and R17 are bias resistors for transistors Q2 and they affect only the open-loop gain, not the closed-loop gain. The purpose of transistor Q2 is merely to extend the output voltage range of the om-amp A1. If the analog input is significantly limited to less than $+V$, the op-amp could be used without transistor Q22. Diode Dl protects transistor Q2 in the off state and prevents loading of the negative source potential, $-V$. In the off state the switch control via lead 22 is an open circuit, and $-V$ is applied through resistors R19 and R20 to the gate electrode. Without diode Dl, base-to-collector junction of Q2 would become forward biased.

The resistive string consisting of thermistor T1 and resistors R11 and R12 develops a voltage at the junction of R11, R12 and R13 which varies only with temperature. The values of these components are adjusted so that the voltage drop across R12 is equal to the absolute gate voltage required with a zero analog input voltage on 20. Thermistor T1 and resistor R11 have been carefully adjusted so that their temperature characteristics will match the required voltage-temperature ($V_{GS}$ v T) characteristics required at gate electrode 11 to maintain $R_{ON}$ at a constant value despite changes in temperature. Temperature variation affects the resistance of thermistor T1 which is reflected in a change in voltage across R12. This voltage change is transferred through the unity gain amplifier (A1 and Q2) and applied to the gate electrode as a change in bias voltage. More precisely, an increase in temperature decreases the resistance of thermistor T1. A drop in resistance of T1 increases the voltage across R12. This same increase in voltage is applied to the gate electrode via A1 and Q2 increasing the gate-to-source voltage causes an offsetting decrease in $R_{ON}$ to compensate for the ambient temperature increase. And, the reverse process occurs for a decrease in temperature. Physically the temperature sensing device and MOSFET 10 should be placed in close proximity to insure that both components are at the same temperature. If sufficient power is developed across the switch such that self heating affects $R_{ON}$, then the temperature sensing device should be placed in thermal contact with the MOSFET. Certainly, there are changes that could be made to the circuitry in FIG. 2 which would not depart from the spirit and scope of this invention. Certainly, a device having a positive temperature coefficient could be used to compensate for the change in voltage merely by placing the positive temperature device in the ground leg of the resistor chain-R11 and R12. A P-type MOSFET could also be used in place of the input merely by changing bias polarities. Certain other changes could also be made to the circuits shown so that both positive and negative excursions of the analog input voltage could be accepted. This could be done by taking the emitter circuits of transistors Q2 and Q3 to an appropriate negative potential.

What is claimed is:
1. Apparatus comprising:
(a) MOSFET switching means having first and second mutually exclusive conductive states, said first conductive state characterized by an internal resistance $R_{ON}$ and said second conductive state characterized by an internal resistance $R_{ON}$ wherein $R_{OFF} >> R_{ON}$, said means also having a source electrode for receiving an analog signal, a drain electrode for transmitting an output signal proportional to the analog signal when the means is in the first state, a gate electrode and a substrate electrode;
(b) bias means having an input, and a first, second, and third output, said input for receiving an external control signal, and first, second, and third outputs connected to said gate, substrate and source electrodes respectively, said bias means, in the presence of the external control signal, applying appropriate bias voltages to the switch means to place the switch means in the appropriate one of first and second conductive states; and (c) compensation means having an input connected to said source electrode and an output connected to said gate electrode, said compensation means providing in the absence of said analog signal a compensating voltage across said electrodes such that the magnitude of $R_{ON}$ remains constant despite ambient temperature variations, and said compensation means in the presence of the said analog signal providing a compensating voltage across said electrodes such that the magnitude of $R_{ON}$ remains constant despite analog signal variations.

2. Apparatus as in claim 1 wherein said MOSFET switching means further comprises an N-channel enhancement mode MOSFET device.

3. Apparatus as in claim 2 wherein said first conductive state is a point of operation in the triode region of the MOSFET device.

4. A MOSFET switching circuit for sampling an analog signal, said circuit having ON and OFF mutually exclusive conductive states, said ON state characterized by an internal resistance $R_{ON}$ and said OFF state characterized by an internal resistance $R_{OFF}$, wherein $R_{OFF} >> R_{ON}$, said circuit comprising:

(a) a MOSFET switching device having a source electrode for receiving an analog signal, a drain electrode for transmitting an output signal proportional to the analog signal when the circuit is in the ON state, a gate electrode and a substrate electrode;

(b) a first terminal for connection to a source of ground potential;

(c) a second terminal for connection to a source of positive potential;

(d) a third terminal for connection to a source of negative potential;

(e) bias means, in the presence of an external control signal, providing appropriate bias voltages to the switching device to place the device in the appropriate one of said ON and OFF conductive states said bias means comprising a first resistor connected between said source and substrate electrodes, a first transistor having a base, emitter, and collector electrodes, the collector electrode connected to said substrate electrode, a second resistor connected between the emitter electrode and said third terminal, a third resistor connected between the emitter and base electrodes, a second transistor having a base, emitter and collector electrodes, the collector electrode of said transistor connected to the base electrode of said first transistor, the emitter electrode of said second transistor connected to said first terminal, a fourth resistor connected to said base electrode of said second transistor, a fifth resistor connected between said gate electrode and the other end of said fourth resistor, and a sixth resistor connected between the junction of said fourth and fifth resistors and said third terminal, said junction of said fourth, fifth, and sixth resistors adapted for connection to said external switch control signal; and (f) compensation means providing, in the absence of said analog signal, a compensating voltage across said gate and source electrodes such that the magnitude of $R_{ON}$ remains constant despite ambient temperature variations, and, in the presence of said analog signal, said compensation means providing a compensating voltage across said gate and source electrodes such that the magnitude of $R_{ON}$ remains constant despite analog signal variations, said compensation means comprising an operational amplifier having an inverting input, a noninverting input, and an output, a seventh resistor connected between said source electrode and said inverting amplifier input, an eighth resistor connected between said inverting amplifier input and said first terminal, a third transistor having a base, emitter, and collector electrodes, said collector connected to said gate electrode, a ninth resistor connected between said amplifier output and said third transistor base electrode, a tenth resistor connected between said first electrode and said third transistor base electrode, an eleventh resistor connected between said first terminal and said third transistor emitter electrode, a twelfth resistor connected between said gate electrode and said noninverting input of said amplifier, a thermistor connected to said third terminal, a thirteenth resistor connected to the other end of said thermistor, a fourteenth resistor connected between said first terminal and said other end of said thirteenth resistor, and a fifteenth resistor connected between the junction of said thirteenth and fourteenth resistors and said noninverting amplifier input.

* * * * *